(12) United States Patent
Deb et al.

(10) Patent No.: US 9,165,731 B2
(45) Date of Patent: Oct. 20, 2015

(54) PROTECTIVE DOOR ASSEMBLY FOR ELECTRICAL DEVICES

(71) Applicant: SCHNEIDER ELECTRIC INDUSTRIES SAS, Rueil Malmaison (FR)

(72) Inventors: Manan Deb, Bangalore (IN); Frank Michael Page, Seneca, SC (US); Sinan Meric, Smyrna, TN (US); Gregory Brent Lee, Smyrna, TN (US); Shylesh D. Rao, Bangalore (IN)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 234 days.

(21) Appl. No.: 13/970,838

(22) Filed: Aug. 20, 2013

(65) Prior Publication Data

US 2014/0061163 A1 Mar. 6, 2014

(30) Foreign Application Priority Data

Aug. 28, 2012 (IN) .......................... 3554/CHE/2012

(51) Int. Cl.
*H01H 33/53* (2006.01)
*H05K 5/00* (2006.01)
*B65D 43/22* (2006.01)
(Continued)

(52) U.S. Cl.
CPC ............... *H01H 33/53* (2013.01); *B65D 43/22* (2013.01); *B65D 43/26* (2013.01); *H01H 71/58* (2013.01); *H05K 5/00* (2013.01); *H05K 5/02* (2013.01); *H01H 9/042* (2013.01); *H02B 1/044* (2013.01);*H02B 1/306* (2013.01); *H02B 1/38* (2013.01); *H02B 13/025* (2013.01)

(58) Field of Classification Search
CPC . H01H 9/22; H01H 33/53; H01H 2009/0292; H01H 33/02; H05K 5/00; H05K 5/02; B65D 43/22; B65D 43/26; H02B 13/025; H01R 13/53
USPC ......... 361/600, 601, 605, 608, 611, 614, 616, 361/618, 622, 624, 627, 634, 636, 641, 652, 361/673, 676; 218/151, 34, 35, 149, 218/155–157; 312/223.1, 265.5, 165.6, 312/296, 236, 326; 174/17 VA, 17 R, 50, 54, 174/58, 68.1, 68.2, 520
See application file for complete search history.

(56) References Cited

U.S. PATENT DOCUMENTS 3,400,353 A * 9/1968 Schockelt .......................... 337/7
4,769,739 A * 9/1988 De Bruin ...................... 361/605
(Continued)

*Primary Examiner* — Michail V Datskovskiy
(74) *Attorney, Agent, or Firm* — Barnes & Thornburg LLP; Mark J. Nahnsen

(57) ABSTRACT

A protective door having push switches, access to racking unit and viewing windows is assembled with the electrical device such that the protective door encloses the electrical device with a flame proof sealing. The push switches and cutout to access racking unit are made aligned with the electrical device such that the switches of the electrical device are actuated through the push switches, racking in and out the device is possible through the cutout to access racking unit and it allows reading the rating plate, display of the electrical device through the viewing windows in the protective door even if the protective door is closed. The push switch has a push rod and a spring loaded push button assembled inside a cylinder and the push button is clamped from the front of the protective door. The push switches are arranged such that a reset switch contact with the position reset switch of the electrical device, push switches to respectively switch ON and Switch OFF the electrical device.

19 Claims, 9 Drawing Sheets

(51) Int. Cl.
　　*H05K 5/02*　　(2006.01)
　　*B65D 43/26*　　(2006.01)
　　*H01H 71/58*　　(2006.01)
　　H01H 9/04　　(2006.01)
　　H02B 1/044　　(2006.01)
　　H02B 1/30　　(2006.01)
　　H02B 1/38　　(2006.01)
　　H02B 13/025　　(2006.01)

(56) References Cited

U.S. PATENT DOCUMENTS

| | | | | |
|---|---|---|---|---|
| 4,864,466 | A | * | 9/1989 | Gasparetto .................... 361/605 |
| 5,905,244 | A | * | 5/1999 | Smith et al. .................. 218/155 |
| 5,986,211 | A | * | 11/1999 | Greer et al. .................... 174/61 |
| 6,301,108 | B1 | * | 10/2001 | Stockbridge .................. 361/688 |
| 6,561,604 | B2 | * | 5/2003 | Leccia et al. .................. 312/326 |
| 6,746,092 | B2 | * | 6/2004 | Leccia et al. .................. 312/222 |
| 7,654,404 | B2 | * | 2/2010 | Kadziolka et al. ........... 220/211 |
| 8,733,853 | B2 | * | 5/2014 | Gingrich ....................... 312/216 |
| 8,733,855 | B2 | * | 5/2014 | Josten et al. ................ 312/223.1 |
| 8,842,421 | B2 | * | 9/2014 | Gingrich ....................... 361/676 |
| 8,960,815 | B2 | * | 2/2015 | Karandikar et al. .......... 312/222 |
| 2008/0092449 | A1 | * | 4/2008 | Kadziolka et al. ........... 49/357 |
| 2008/0148642 | A1 | * | 6/2008 | Mathieu ........................ 49/395 |
| 2009/0173118 | A1 | * | 7/2009 | Schulz et al. ................. 70/275 |
| 2009/0180242 | A1 | * | 7/2009 | Coomer et al. ............... 361/636 |
| 2010/0072039 | A1 | * | 3/2010 | Coomer et al. ............. 200/50.21 |
| 2012/0097413 | A1 | * | 4/2012 | Bugaris et al. ................. 174/50 |

* cited by examiner

PROTECTIVE DOOR ASSEMBLY FOR ELECTRICAL DEVICES

This application claims priority to Indian Patent Application No. 3554/CHE/2012, filed Aug. 28, 2012, the content of which is herein incorporated by reference in its entirety.

FIELD OF DISCLOSURE

The present Disclosure relates to the passive protection against internal arc, and more particularly to a protective secondary door to eliminate the risk of out gassing during the event of arc flash. The secondary protective door encloses the circuit breakers of the electrical enclosure with a flame proof sealing. Additionally, it allows access to essential circuit breaker controls for example switches, racking unit and position reset button etc. even when the protective door is closed.

BACKGROUND OF DISCLOSURE

Arc flash is a common phenomenon in all the electrical enclosures as switchboards, switchgears, motor control centre, panelboard etc. Arc flash can be described as a short circuit through air that flashes from one live conductor to another conductor or to the ground, in which large amounts of light and waves of heat energy are released explosively from electrical equipment. The amount of heat produced by an arcing event in low and medium energy equipment can be very large. The electric arc produced by these sources can jump anywhere from a few inches to several feet, depending on the voltage level involved.

As electricity travels through body, literally seeking ground, it leaves a path of harm and destruction all along the path it takes inside of body. The high temperature during internal arc evaporates the nearby materials and heats up the surrounding air, which results in an overpressure in the switchgear compartment. Extreme pressure exerts a significant force on the enclosure structure such as frame, door, side panels, rear panels, roofs etc. and often dislodges these parts.

Most of the time the operator become the victim during the course of actions at workplace that involve electrical equipment. Arc flash can cause traumatic injuries. The superheated ball of gas accompanying the flash can cause burns over entire body and lung, even death from these injuries is a real possibility, since the human body is a great conductor of electricity. The hot gases and the transient pressure waves may endanger persons close to the switchgear and may seriously damage the electrical equipment and the building. In a typical arc resistant electrical enclosure, besides the mechanical stress to equipment, the danger to persons close to the electrical enclosure must be excluded. Here, after exceeding a predetermined pressure limit, the hot gases trigger over pressure relief devices and the enclosure structure should withstand the high pressure until it is released completely.

If an operator is working on a circuit breaker and say an arc event takes place then there would be minimum protection to him in the form of a door. The door can deform due to the pressure of arc and the flames and gases may affect the operator. The gases can also come out from the circuit breaker front face, sealing and sides of door. During an arcing event the high temperatures and pressure generated are sufficient enough to burn a Human Being and it also vaporize all materials in the vicinity of the arc.

In order to overcome the arc effects, various approaches have tried to make the existing doors rigid by improving the latches, hinges or by providing the gaskets to existing door to avoid gases coming out. In the above cases, gases and plasma may melt the gaskets or circuit breaker casing which may allow escaping of the gases. Additionally, a high intensity blast may bend the door making the gases escape. Also in all the cases the operator has to rack in or out without any protection as the circuit breaker will be protruding out of the door.

Another approach is tried to provide bellows to cover the circuit breaker. Even in this case the bellows may melt due to a high intensity blast again making it unsafe. Arc flash incidents are common and costly, and the frequency of reported accidents is increasing and the overall safety industry is concerned. The occurrence of arcing inside switchgear has many undesirable effects. The arc energy can cause sudden pressure increase inside the enclosure resulting in severe mechanical and thermal stress on the equipment particularly on doors.

The safety of operators against hot gases, radiation and fragmentation of the enclosure must be secured. The important acceptance criteria must be fulfilled for a successful internal arc test, e.g. correctly secured doors and covers do not open or indicators do not ignite due to the effects of hot gases. It is necessary to protect the operator working on the device from any accidents and also helping in redirecting the arc to proper ventilating paths, thus exhaling the gasses to the intended exhaust.

However, in all the above cases the operator is not completely safe and in all the cases the operator has to ensure that either he wears protective devices or he has to take extra precautions to avoid from the arc during a circuit breaker switching and racking operation. Therefore it is desirable to provide an improved protection system for the circuit breaker which overcomes all the disadvantages of the conventional protection system and to withstand the effects of an internal arcing fault, thereby protecting the operator from the accidents due to arcing effects.

OBJECT OF THE DISCLOSURE

The main object of the present Disclosure is to provide a protective door which adds an extra degree of protection to the operator from accidents associated with internal arcs.

Another object of the present Disclosure is to provide improved protective door assembly for the circuit breaker, which overcomes the disadvantages of the conventional protection system against internal arc.

Another object of the present Disclosure is to provide arc resistant electrical enclosure for circuit breakers designed to withstand the effects of an internal arcing fault.

Another object of the present Disclosure is to protect the operator from any accidents due to arc flash inside the circuit breaker.

Further object of the present Disclosure is to provide a protective door which helps to operate all the functions of circuit breakers even if the protective door is in closed condition.

Further object of the present Disclosure is to provide a protective door which allows racking in and racking out of the circuit breaker even if the protective door is in closed condition.

Further object of the present Disclosure is to provide an improved protective door which can be directly installed on the existing switch gear doors with minor modifications.

Still Further object of the present Disclosure is to provide a protective door which can be used in the existing circuit breaker without any major modifications.

SUMMARY OF THE DISCLOSURE

The present Disclosure which achieves the objectives relates to a protective door assembly for an enclosure or switchgear or switchboard of electrical devices such as circuit breaker. The present Disclosure aims to protect the operator from the arc effects, so that even if an arc event takes place during operation of the circuit breaker the operator and the surrounding environment are kept safe.

The protective door assembly is provided with a protective door having push button type switches, cutout to provide access to racking unit and viewing windows. The protective door is assembled with the regular door of the enclosure such that the protective door encloses the front face of the circuit breaker with a flame proof sealing. The push type switches are made aligned with the switching units the circuit breaker such that the switches of the circuit breaker can be actuated through the push switches. The racking in/out of the circuit breaker is possible by inserting the racking rod through the cutout provided on the protective door to access the racking unit. The cutout has a spring loaded racking damper which is fixed to the inner surface of protective door and normally closes the opening of the cutout due to spring force or gravity. This does now allow any gas or plasma to come out through the cutout during an arc flash event. When, the racking rod of a breaker is inserted from outside it applies a force on the spring loaded racking damper which opens the damper plate and allows access to the racking unit of the circuit breaker. The operator can view and read the rating plate and display of the circuit breaker through the viewing windows in the protective door. The number of viewing window in the protective door is optional; a protective door can have a few viewing windows depending on the application requirement. The push switch has a spring loaded push button assembled inside a cylinder and the push button is clamped from the front of the protective door.

During the process of racking out the whole assembly of push switch comes out of the door and the push switch return to its original position once the circuit breaker is racked in back. The push switches are arranged such that at least one push switch is in contact with the position reset switch and at least two push switches are to switch ON and switch OFF the circuit breaker respectively. The push switches installed over the protective door and the windows in the protective door enables to read the rating plate and display of the circuit breaker.

The protective door is hinged onto the regular door of the enclosure such that said protective door is opened through said hinges to access the circuit breaker. The protective door is directly installed in front of the circuit breaker on the regular door such a way that, the operator can switch ON/OFF, rack in and out, reset the position of the circuit breaker and read the rating plate and display of the circuit breaker even when the protective door is closed. By installing this protective door assembly we can protect the operator during an internal arc event from burns, direct contact from the flying components, deadly hot gases especially on the front end of the electrical enclosure.

The protective door enables the front end of the circuit breaker completely sealed, thus the gasses and plasma are channeled out of the enclosure through the given ventilated paths. The addition of protective door guards the operator from the hot gases and plasma coming out from the front end of the circuit breaker during an arc flash event. The protective door assembly provides a complete internal arc protection to the operator, even during racking in and racking out of the circuit breaker.

The protective door loaded arc resistant switchgear/circuit breaker can withstand the effects of an internal arcing fault. The protective door is a modular design where in the door can be directly installed on the existing switch gear doors with minor modifications and can be used in the existing circuit breaker without any modifications. With the application of protective door an operator can confidently work on the live Switch board, i.e. an operator can switch ON/OFF circuit breaker, rack in/out the breaker, use position reset button, read the indications in the display of the device from a close vicinity etc.

The protective door according to the present Disclosure, functions along with a regular door, but giving an extra protection from arc event. The protective door adds an extra degree of protection to the operator from plasma blast, fire burns, direct pressure blast, flying components and prevent inhalation of deadly gasses associated with electrical arcs.

BRIEF DESCRIPTION OF DRAWINGS

The drawings being referred herein are for the purpose of illustrating a preferred embodiment of the invention only, and not for the purpose of limiting the same.

DETAILED DESCRIPTION

The protective door assembly according to the present invention can be installed on any electrical device of an enclosure to avoid the arcing effects during any internal arc event inside the enclosure. The electrical device according to the present invention is applicable to any electrical device and does not limited to circuit breaker. Similarly, the enclosure in which the protective door is installed according to the present invention is applicable to any electrical enclosure and does not limited to switchboards, switchgears, motor control centre, panelboard. The present invention relates to a protective system to be installed with circuit breakers to eliminate the risk of arcing effects during an internal arc event. The protective door encloses the circuit breakers of the electrical enclosure with flame proof sealing and provided with push type switches to switch on/off and reset the circuit breaker even if the protective door is closed. The circuit breakers are provided with electrical enclosures whose function is to maintain and protect the required the flow of electrical current in an electrical circuit.

Figure 1:
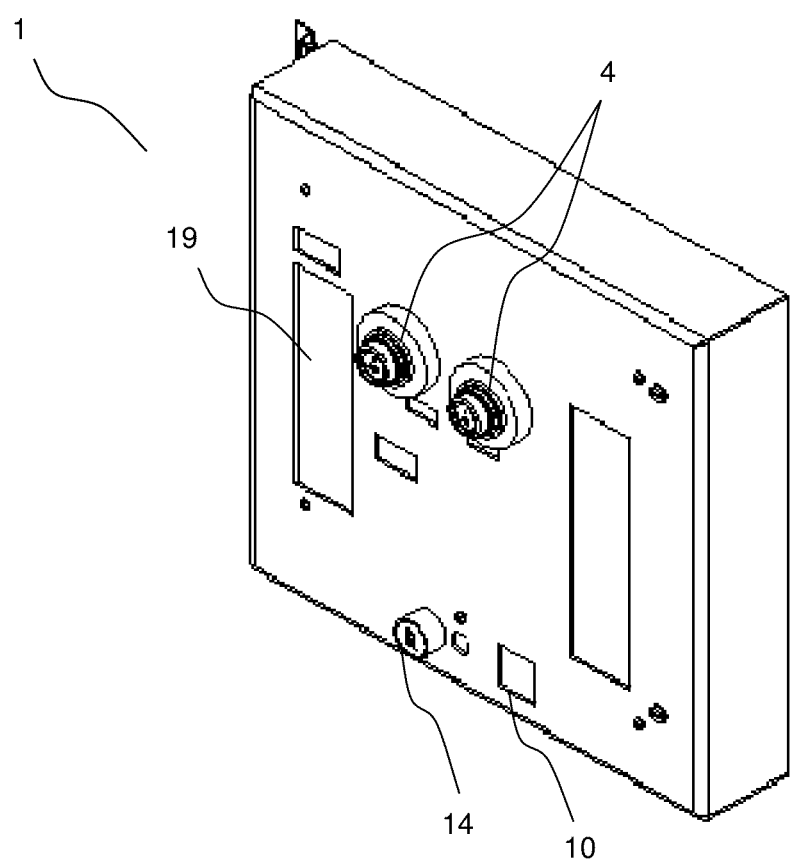
FIG. 1 shows a view of the protective door assembly for a circuit breaker, in accordance to the exemplary embodiment of the present invention.
Figure 2:
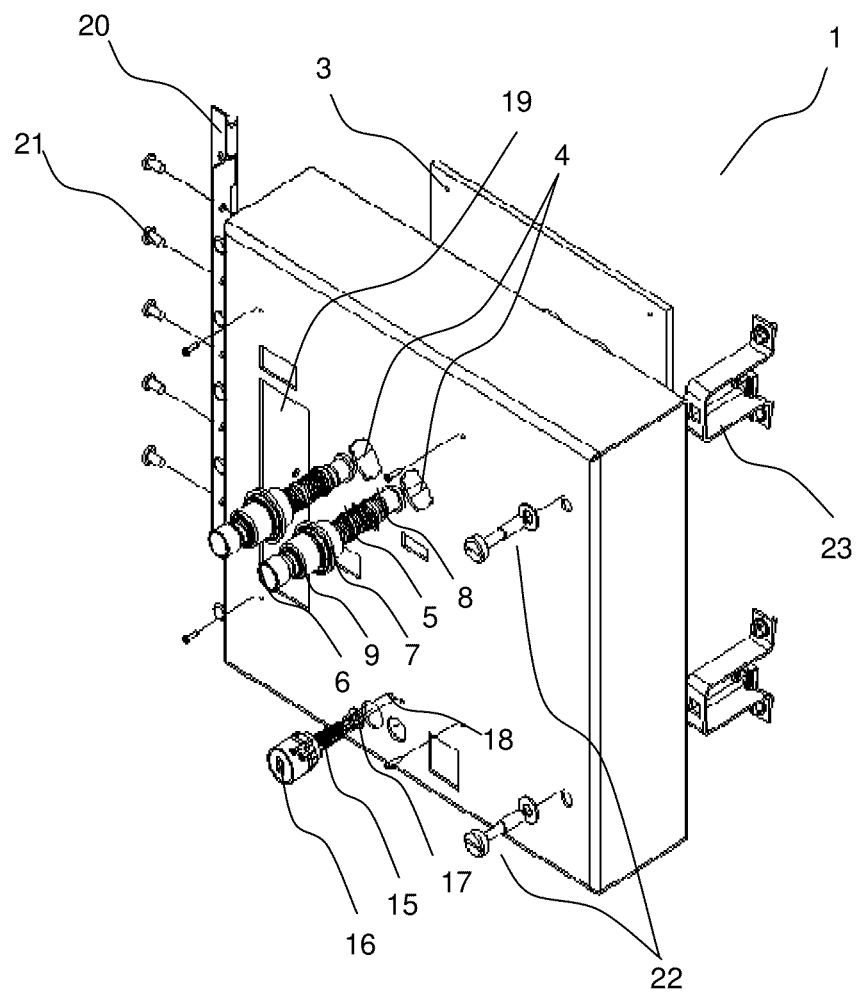
FIG. 2 shows an exploded view of the protective door assembly having push switches and racking unit, in accordance to the exemplary embodiment of the present invention.

FIGS. 1 and 2 shows the protective door assembly for a circuit breaker, in accordance to the present invention. The protective door (1) is provided with a set of push switches (4) for switching the circuit breaker (2), a cutout (10) to access racking unit for racking in and out of the circuit breaker (2) and viewing windows (19) for reading the rating plate and display of the circuit breaker. A transparent Lexan plate (3) is assembled with the circuit breaker side of the protective door (1) which provides a flame proof transparent sealing to the viewing windows (19). A push type reset switch (14) is provided with the protective door (1) to reset the position of the circuit breaker (2) during racking such that actuation of the reset switch (14) in the protective door (1) contacts and actuates the position reset switch (not shown) of the circuit breaker (2).

The push switches (4), rest switch (14) and cutout (10) to access racking unit are made aligned to the switching units (not shown) and racking units (not shown) of the circuit breaker (2) such that the switches of the circuit breaker are actuated respectively through the push switches (4), rest switch (14) and racking in and out the circuit breaker is possible by inserting a racking rod (11) through the cutout (10) even if the protective door is closed.

Figure 3:
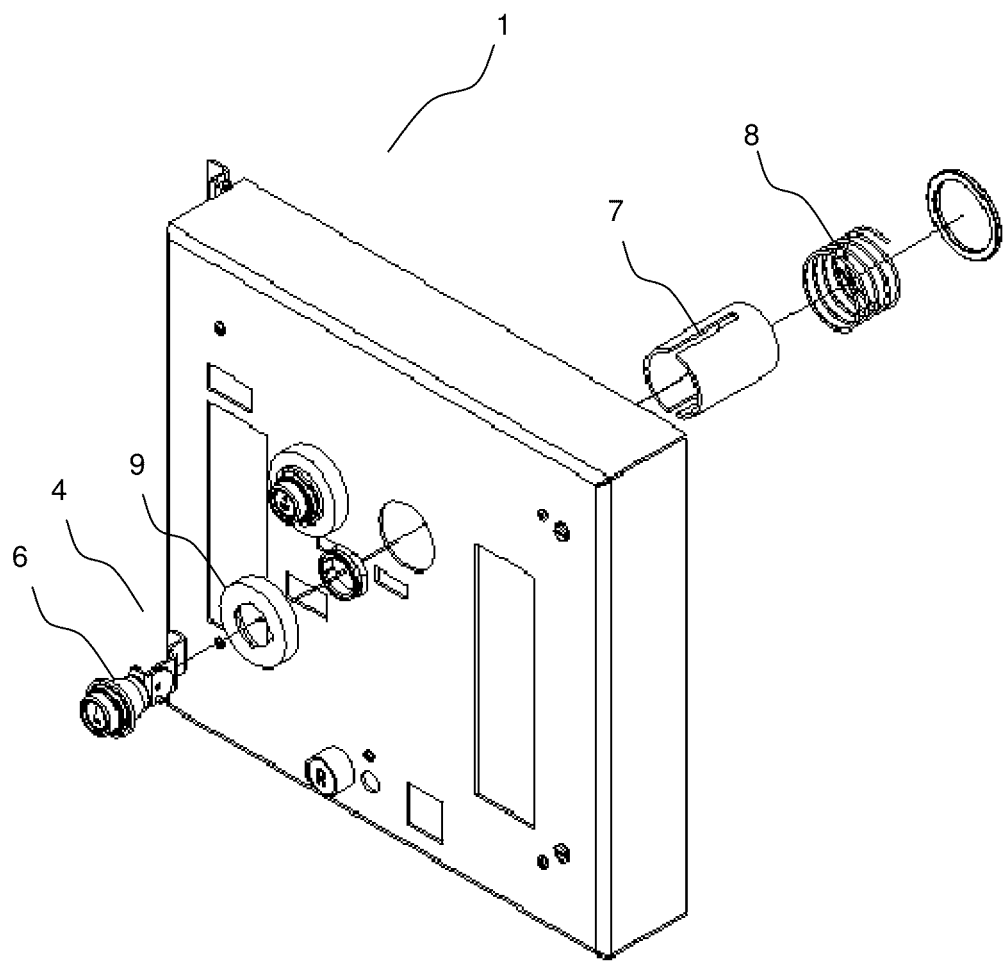
FIG. 3 shows an exploded view of the push switch assembly placed in the protective door, in accordance to the exemplary embodiment of the present invention.

FIG. 3 shows an exploded view of the push switch assembly placed in the protective door, in accordance to the present invention. The push switches (4) installed over the protective door enables the operator to switch on the circuit breaker and reset switch (14) provided on the protective door enable the operator to reset the position of the circuit breaker during racking. The protective door (1) is constructed such that the protective door is hinged onto the regular door of the enclosure (24) and the protective door is opened through the hinges (20) to access the electrical device. The protective door (1) is directly installed on the electrical device doors such that the operator can work on the live electrical enclosure (24) of the circuit breaker (2), and the operator can switch ON/OFF the circuit breaker, rack in and out the device, reset the position of the device and read the display of the electrical device even if the protective door is closed.

The viewing windows (19) are provided with the protective door (1) to view and observe the circuit breaker display and the switch actuation in the circuit breaker. The operator of the circuit breaker (2) is enabled to read the display of the circuit breaker through the windows (19) provided in the protective door. The viewing windows (19) are provided with the protective door (1) to view and read the display on the circuit breaker (2). The viewing windows (19) are transparent Lexan sheet (3) mounted on protective door which helps the operator to view the position, readings and other required data from the circuit breaker.

The push switch (4) has a push rod (5) and a push button (6) assembled such that the push rod (5) upon actuation through the push button (6), contact the switch of the circuit breaker to enable the switching operation for the electric device. The push switch (4) has a compression (8) spring loaded push button (6) assembled inside a cylinder body (7) and the push button (6) is clamped at the front portion of the protective door (1). A collar (9) is provided to secure the push switch (4) at the protective door through the hole provided at the front face of the protective door (1).

The actuation of the push button (6) in the push switch (4) enables the push rod to move forward and hit the switch of the circuit breaker (2) to switch on the circuit breaker. A recess provided in the cylindrical body (7) keep the push rod (5) in the actuated condition, up on further actuation of the push button (6) in the push switch the push rod (5) is released from the actuated condition and the push rod (5) return back to its original position. The compression spring (8) loaded with the push rod (5) enables the push rod (5) to return back to its original position or to a non actuated condition.

The reset switch (14) has a reset rod (15) and a reset button (16) assembled such that the reset rod (15) upon actuation through the reset button (16), contact the reset switch of the circuit breaker to enable the reset operation for the electric device. The reset switch (14) has a compression (17) spring loaded reset button (16) assembled through the collar (18) provided with the protective door. The actuation of the reset button (16) in the reset switch (14) enables the reset rod (15) to move forward and reset the circuit breaker. The compression spring (17) loaded with the reset rod (15) directs the reset rod (15) to return back to its original position after resetting the circuit breaker.

The protective door (1) is secured onto the circuit breaker through the fastening screws (22). The fastening screws (22) are screwed on to the mounted unit (23) provided onto the regular door (24). Disassembling the protective door (1) through the fastening screws (22) enables the operator to have direct access to the circuit breaker, when the screws are unlocked. The protective door (1) is secured to switch board or to the door of the circuit breaker (2) with a flame proof sealing, so that the operator and the switching environment is protected from the accidents due to the arcing effects of the circuit breaker. During the process of racking out the whole assembly of push switch comes out of the door (FIG. 4b) and the push switch return to its original position once the circuit breaker is racked in back.

Figure 4:
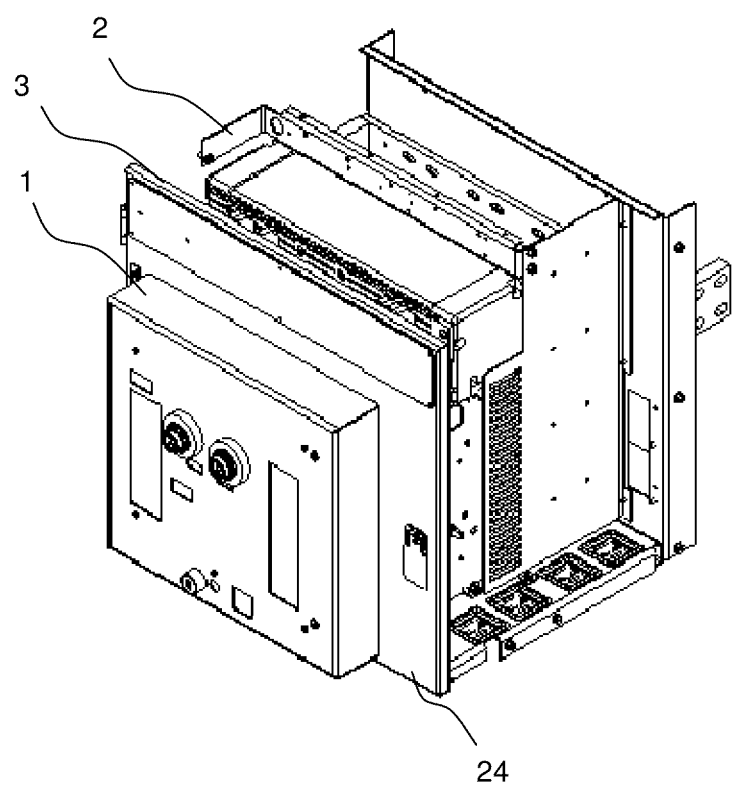
FIG. 4 shows a circuit breaker cell of switchgear enclosed with the protective door assembly, in accordance to the exemplary embodiment of the present invention.

FIG. 4 shows a circuit breaker enclosed with the protective door assembly, in accordance to the exemplary embodiment of the present invention. The protective door (1) is assembled with the switch board face (3) of the circuit breaker (2) with a flame proof protection seal. The installation of the protective door assembly (1) with the circuit breaker (2) allows the operator to operate the circuit breaker (2) through the switches (4) in the protective door and protect the operator from the accidents due to the arcing effects of the circuit breaker, such as burns, direct contact from the flying components, deadly gases especially on the front end of the switch gear.

During the process of racking the whole assembly of push button comes out of the door and the push switch (4) return to its original position once the circuit breaker is racked back. The push switches are arranged such that the reset switch contact with the reset switch of the electrical device and the push switches respectively switch ON and switch OFF the electrical device. The push switches (4) installed over the protective door (1) reset the position of the electrical device and the windows (19) in the protective door enables to read the display of the electrical device (2).

The operator normally has to ensure that the circuit breakers has to be powered off while racking out or racking in, in case of a mistake it may lead to arc phenomenon leading to hazards. Not only during the maintenance, but a phenomenon of arc may also occur due to improper maintenance, atmospheric conditions, switching over voltages, dielectric faults of solid insulation materials, overstress of load break switches, rodents etc. The protective door (1) according to the present invention provides maximum safety to the operator and the equipment even during the maintenance. It also helps to protect the surroundings of the switch gear when an arc explosion occurs. It also helps in guiding the gases to proper exhaust outlet.

Figure 5A:
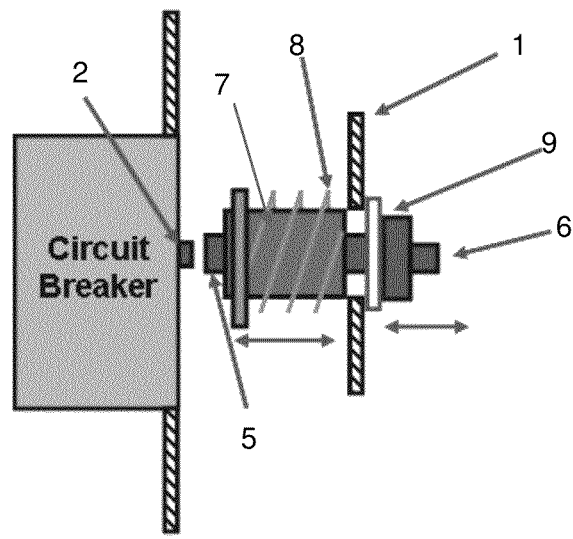
FIG. 5a shows a view of operation of the push switch for the protective door assembly, in accordance to the present invention.
Figure 5B:
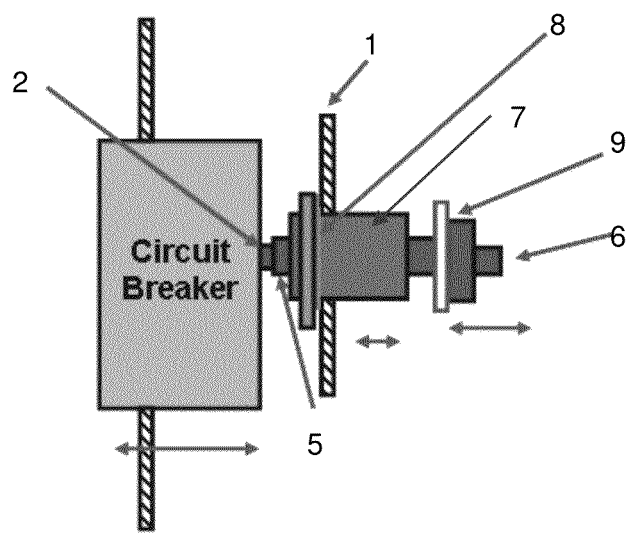
FIG. 5b shows the state of the push switch for the protective door assembly when circuit breaker in racked out position, in accordance to the present invention.

FIGS. 5a and 5b shows the push switch for the protective door assembly, in accordance to the present invention. The push switch (4) has a push rod (5) and a push button (6) installed over the protective door (1) which helps the operator to switch on the circuit breaker. This push rod (5) and push button (6) are assembled inside a cylinder body (7) which is compression spring (8) loaded and enables the push rod (5) to travel forward and to actuate the switch at the circuit breaker. A collar (9) is provided to secure the push switch (4) at the protective door through the hole provided at the front face of the protective door (1). During the process of racking the whole assembly of push button comes out of the protective door, since the assembly is spring loaded once the circuit breaker is racked back the switch will return to its original position.

Figure 6:
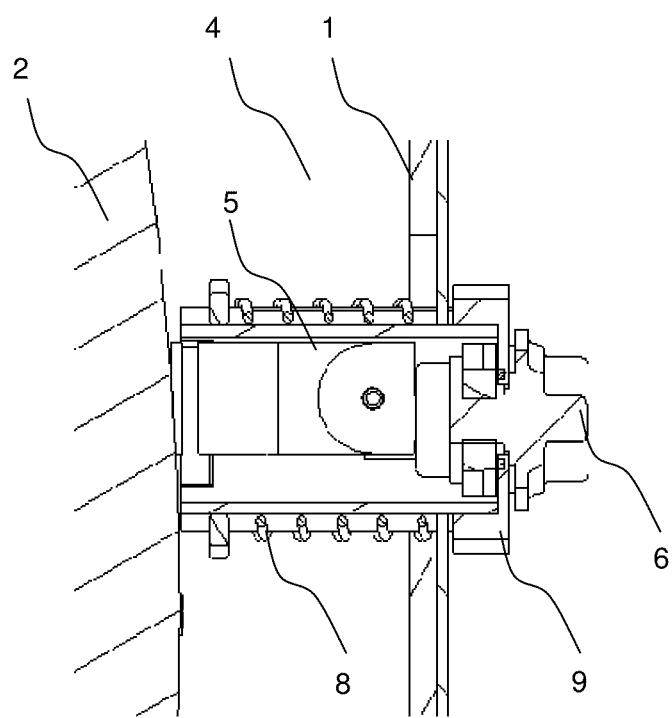
FIG. 6 shows a cut section view of the push switch for the protective door assembly, in accordance to the present invention.

FIG. 6 shows a cut section view of the push switch for the protective door assembly, in accordance to the present invention. The actuation of the push button (6) in the push switch (4) enables the push rod to move forward and hit the switch of the circuit breaker (2) to switch on/off the circuit breaker. A recess provided in the cylindrical body (7) keep the push rod (5) in the actuated condition, up on further actuation of the push button (6) in the push switch the push rod (5) is released from the actuated condition and the push rod (5) return back to its original position. The compression spring (8) loaded with the push rod (5) enables the push rod (5) to return back to its original position or to a non actuated condition.

Figure 7A:
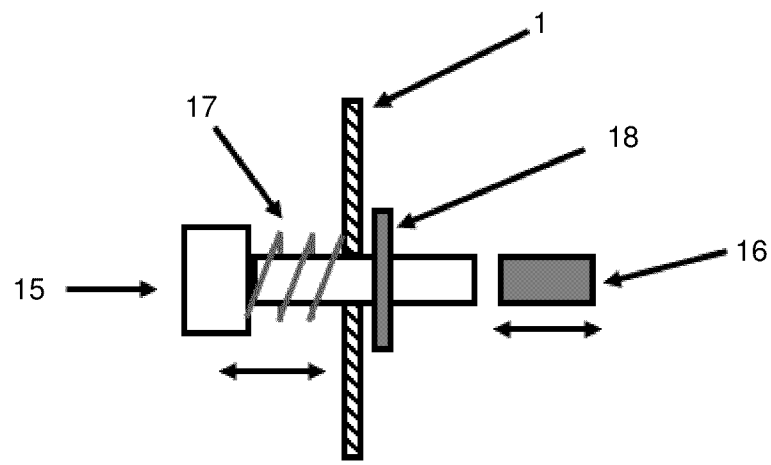
FIG. 7a shows the operation of the reset switch for the protective door assembly, in accordance to the present invention.
Figure 7B:
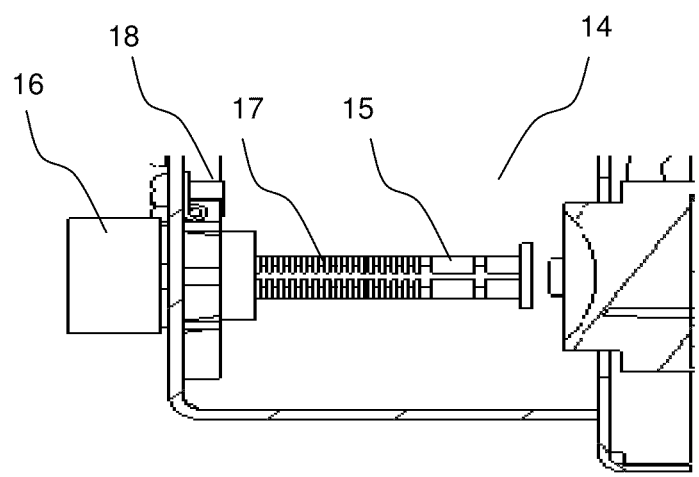
FIG. 7b shows the cut section view of the reset switch for the protective door assembly, in accordance to the present invention.

FIGS. 7a and 7b shows the reset switch for the protective door assembly, in accordance to the present invention. The reset switch (14) has a reset rod (15) and a reset button (15) provided to reset the position of the circuit breaker. The reset switch (14) is installed over the protective door which helps the operator to reset the position of circuit breaker. The reset rod (15) and a reset button (16) assembled such that the reset rod (15) upon actuation through the reset button (16), contact the reset switch of the circuit breaker to enable the reset operation for the electric device.

The reset switch (14) has a compression spring (17) loaded reset button (16) assembled through the collar (18) provided with the protective door. The actuation of the reset button (16) in the reset switch (14) enables the reset rod (15) to move forward and reset the circuit breaker. The compression spring (17) loaded with the reset rod (15) directs the reset rod (15) to return back to its original position after resetting the circuit breaker.

Figure 8A:
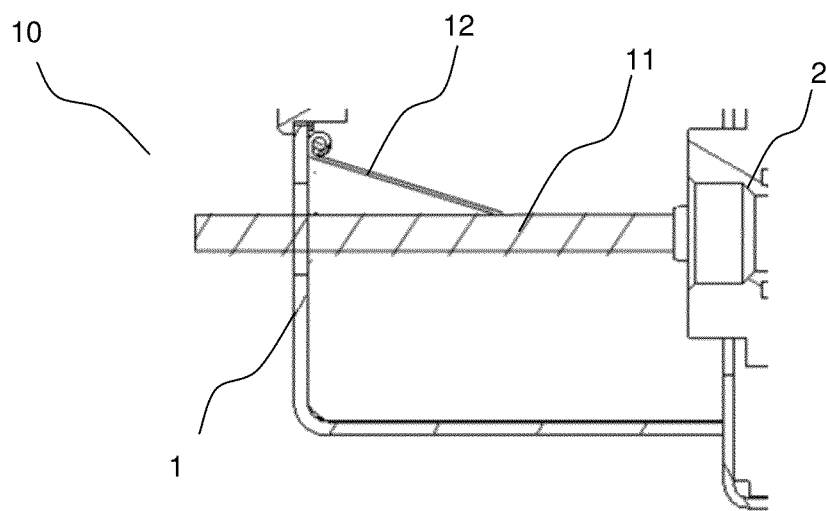
FIG. 8a shows a view of the cutout with spring loaded racking damper of the protective door assembly to access the racking unit of the circuit breaker, in accordance to the present invention.
Figure 8B:
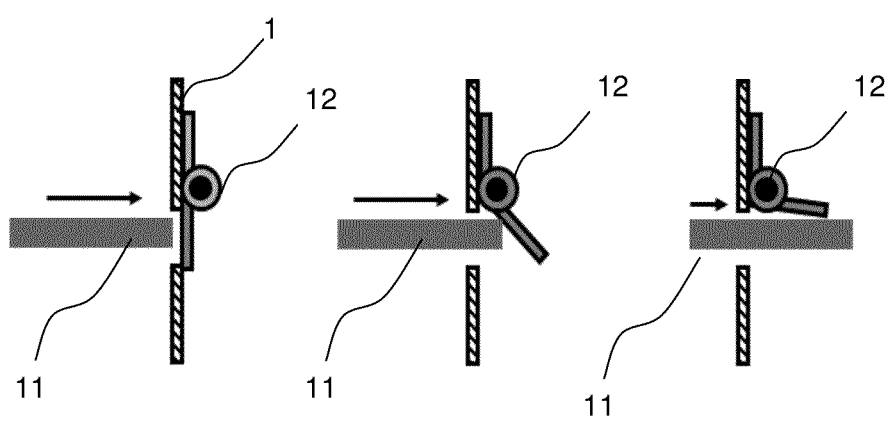
FIG. 8b shows the operation of the cutout with spring loaded racking damper of the protective door assembly to access racking unit of the circuit breaker, in accordance to the present invention.

FIGS. 8a and 8b shows the cutout to access the racking unit for the protective door assembly, in accordance to the present invention. The cutout (10) has a racking rod (11) and a spring loaded racking damper (12) provided to access the racking unit of the circuit breaker. The spring loaded racking damper (12) is fixed to the inner surface of protective door (1), when the racking rod (11) is pushed in to through the protective door racking hole opens assisting the racking rod (11) to position to the racking hole in circuit breaker, and when the racking rod (11) is removed, the spring loaded racking damper (12) return to its original position to close the cutout (10) opening provided to access the racking unit.

The racking process according to the present invention helps to protect the arc coming out of the door through the cutout (10) to access racking unit. The access to racking unit is provided with the protective door to rack in and out the circuit breaker and to release the gases available in the protective door through the gas exit provided in the electrical device. This racking of electrical device will enable the gases to pass out through the specified provisions and prevent the operator due from the accidents due to the arcing effects and the harmful gases.

Figure 9:
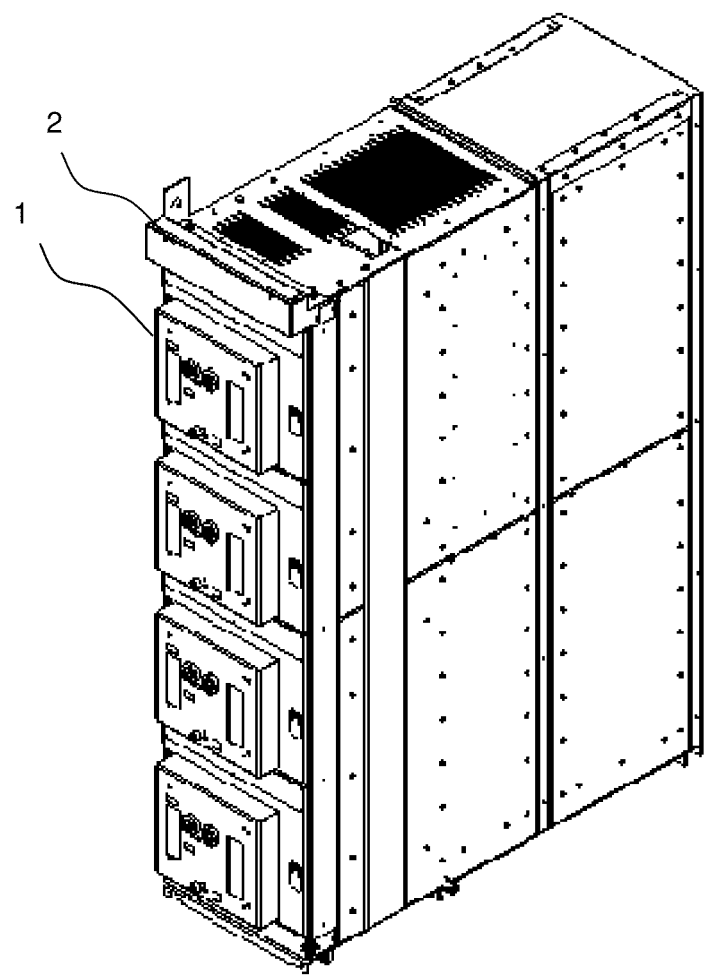
FIG. 9 shows a view of a section of the electrical enclosure with circuit breaker having enclosed with the protective door assembly, in accordance to the exemplary embodiment of the present invention.

FIG. 9 shows a view of a section of the electrical enclosure with circuit breaker having enclosed with the protective door assembly, in accordance to the exemplary embodiment of the present invention. The protective door (1) is directly installed in front of the circuit breaker on the regular door of the electrical enclosure (24) such that the operator work on the live Switch board of the electrical device, the operator can switch ON/OFF the circuit breaker, rack in and out the device, reset the device and read the display of the electrical device. By installing a protective door assembly we can protect the operator from burns, direct contact from the flying components, deadly gases especially on the front end of the switch gear. The present invention is a modular design which can be directly mounted on the existing door just by giving some extra holes on the door to mount the protective door hinges. The protective door helps to operate all the functions of circuit breakers with the door closed. The circuit breaker can even be racked in, racked out, reset and read keeping the protective doors closed. This gives an extra protection for operator.

The protective door loaded arc resistant switchgear or circuit breaker can withstand the effects of an internal arcing fault. The protective door is a modular design where in the door can be directly installed on the existing switch gear doors with minor modifications and can be used in the existing circuit breaker without any modifications. With the application of protective door an operator can confidently work on the live Switch board, i.e. an operator can switch ON/OFF circuit breaker, rack in/out the breaker, use reset button, read the indications in the display of the device from a close vicinity etc.

The protective door enables the front end of the circuit breaker completely sealed, thus the gasses and plasma are channeled out of the enclosure through the given ventilated paths. The addition of protective door guards the operator from the hot gases and plasma coming out from the front end of the circuit breaker during an arc flash event. The protective door assembly provides a complete internal arc protection to the operator, even during racking in and racking out of the circuit breaker. The protective door according to the present invention, functions along with the regular door, but giving an extra protection from arc event. The protective door adds an extra degree of protection to the operator from plasma blast, fire burns, direct pressure blast, flying components and prevent inhalation of deadly gasses associated with electrical arcs.

The present invention is applicable to any kind of circuit breakers and doors, irrespective of size and dimensions. This improved protective door provides complete internal arc protection even during racking in and racking out of the breaker. The present invention allows a protection for the internal arc in the circuit breaker cell with a very less cost for manufacturing, installation and maintenance.

The foregoing description is a specific embodiment of the present invention. It should be appreciated that this embodiment is described for purpose of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

We claim:

1. A protective door assembly for electrical devices, said assembly comprises,
   a protective door having push switches, cutout with a spring loaded racking damper allowing access to racking unit, reset switch and viewing window, is assembled with the electrical device, such that said protective door encloses the electrical device of the electrical enclosure with flame proof sealing;
   wherein said push switches, cutout with a spring loaded racking damper allowing access to ON/OFF switch, racking unit and reset switch are made to aligned with the electrical device such that the switches of the electrical device are actuated through said push switches, the cutout to access racking unit allows rack in and out the device and read the display of the electrical device through said viewing windows in the protective door.

2. The protective door assembly as claimed in claim 1, wherein said push switch has a push rod and a spring loaded push button assembled inside a cylindrical body and said push rod is clamped at the front of the protective door through a push button collar.

3. The protective door assembly as claimed in claim 1, wherein said push switches are in contact with the switches of the circuit breaker, such that up on actuation of the push switch, the push rod moves forward and actuates the electrical device.

4. The protective door assembly as claimed in claim 1, wherein at least two push switches are constructed to respectively switch ON and Switch OFF the electrical device.

5. The protective door assembly as claimed in claim 1, wherein at least one reset switch is provided to reset the position of the electrical device during racking.

6. The protective door assembly as claimed in claim 1, wherein said reset switch has a reset rod and a spring loaded reset button, and said reset rod is clamped at the front of the protective door through a reset collar.

7. The protective door assembly as claimed in claim 1, wherein said reset switch installed over the protective door return to original position after resetting the electrical device.

8. The protective door assembly as claimed in claim 1, wherein said electrical device is racked in and out through the cutout provided to access the racking unit.

9. The protective door assembly as claimed in claim 1, wherein said racking unit has a racking rod and a spring loaded racking damper.

10. The protective door assembly as claimed in claim 1, wherein said spring loaded racking damper is screwed to the inner surface of protective door.

11. The protective door assembly as claimed in claim 1, wherein when the racking rod is pushed in to through the protective door racking hole, the racking rod moves forward and get inserted into the racking hole in electrical device.

12. The protective door assembly as claimed in claim 1, wherein when the racking rod is removed from the racking hole, the racking damper closes the racking hole and prevents the arc coming out of the protective door through the racking hole.

13. The protective door assembly as claimed in claim 1, wherein said protective door is constructed such that the operator is capable of being switch ON/OFF said electrical device, rack in and out the device, reset the position of the device and read the display of the electrical device even if the protective door is closed.

14. The protective door assembly as claimed in claim 1, wherein said electrical device is a circuit breaker.

15. The protective door assembly as claimed in claim 1, wherein said protective door is directly installed on the electrical device such that the operator is capable of being work on the live switch board of the electrical device.

16. The protective door assembly as claimed in claim 1, wherein said protective door is hinged onto the regular door in front of the electrical device such that protective door is opened through said hinges to directly access the electrical device.

17. The protective door assembly as claimed in claim 1, wherein said door is secured onto the circuit breaker through fastening screws.

18. The protective door assembly as claimed in claim 1, wherein the fastening screws are screwed with mounted unit which is mounted onto the regular door.

19. An electrical device having a protective door assembly as claimed in claim 1.

* * * * *